United States Patent
Hsu et al.

(10) Patent No.: US 10,248,590 B2
(45) Date of Patent: Apr. 2, 2019

(54) SUPPORTING DIFFERENT TYPES OF MEMORY DEVICES BASED ON SERIAL PRESENSE DETECT

(71) Applicant: Hewlett-Packard Development Company, L.P., Houston, TX (US)

(72) Inventors: Jen-Chun Hsu, Taipei (TW); Roger A. Pearson, Fort Collins, CO (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 15/543,191

(22) PCT Filed: Jan. 28, 2015

(86) PCT No.: PCT/US2015/013350
§ 371 (c)(1),
(2) Date: Jul. 12, 2017

(87) PCT Pub. No.: WO2016/122498
PCT Pub. Date: Aug. 4, 2016

(65) Prior Publication Data
US 2018/0011806 A1    Jan. 11, 2018

(51) Int. Cl.
| | | |
|---|---|---|
| G06F 13/00 | (2006.01) | |
| G06F 13/16 | (2006.01) | |
| G11C 7/10 | (2006.01) | |
| G11C 5/06 | (2006.01) | |

(52) U.S. Cl.
CPC .......... G06F 13/1694 (2013.01); G11C 5/066 (2013.01); G11C 7/10 (2013.01)

(58) Field of Classification Search
CPC ........ G06F 13/1694; G11C 5/066; G11C 7/10

USPC ............. 365/226, 149; 711/154, 5; 713/1, 2; 710/11, 15, 71, 74
See application file for complete search history.

(56) References Cited

U.S. PATENT DOCUMENTS

| | | | |
|---|---|---|---|
| 7,698,527 B2 | 4/2010 | Meng et al. | |
| 8,051,253 B2 * | 11/2011 | Okin ................... | G06F 13/1684 711/154 |
| 8,713,249 B2 | 4/2014 | Berke | |

(Continued)

FOREIGN PATENT DOCUMENTS

| | | |
|---|---|---|
| WO | WO-2008040028 | 10/2008 |
| WO | WO-2014143056 A1 | 9/2014 |

OTHER PUBLICATIONS

Gasior, Geoff, "Report: AMD's Next-gen Carrizo APU Supports DDR4, Integrates Chipset," Mar. 19, 2014, 1 page, TechReport.com.

*Primary Examiner* — Hong C Kim
(74) *Attorney, Agent, or Firm* — HP Inc. Patent Department

(57) ABSTRACT

A computing system for supporting a plurality of different types of memory devices includes a memory voltage regulator. The memory voltage regulator adjusts a supply voltage to a requisite voltage for a detected memory device based on serial presence detect (SPD) data. The computing system further includes a memory controller that supports a plurality of types of memory devices. The memory controller receives data regarding the type of the detected memory device, and controls input/output signals relative to the type of the detected memory device based on the SPD data and the GPIO data of the detected memory device.

13 Claims, 5 Drawing Sheets

(56) References Cited

U.S. PATENT DOCUMENTS

| | | | |
|---|---|---|---|
| 2008/0259553 A1* | 10/2008 | Hsu | G06F 1/26 |
| | | | 361/679.31 |
| 2010/0042778 A1* | 2/2010 | Tanguay | G06F 13/1694 |
| | | | 711/105 |
| 2010/0251543 A1 | 10/2010 | Hoang | |
| 2010/0269012 A1 | 10/2010 | Hazelzet | |
| 2011/0082971 A1 | 4/2011 | Berke | |
| 2012/0159045 A1 | 6/2012 | Hinkle et al. | |
| 2013/0054949 A1* | 2/2013 | Berke | G11C 5/14 |
| | | | 713/2 |
| 2013/0304981 A1 | 11/2013 | Paz | |
| 2013/0318280 A1 | 11/2013 | Dalal et al. | |
| 2014/0122966 A1 | 5/2014 | Berke et al. | |
| 2014/0268973 A1 | 9/2014 | Connolly | |

\* cited by examiner

SUPPORTING DIFFERENT TYPES OF MEMORY DEVICES BASED ON SERIAL PRESENSE DETECT

CROSS-REFERENCE TO RELATED APPLICATIONS

This application is a national stage application under 35 U.S.C. § 371 of International Application No. PCT/US2015/013350 entitled "SUPPORTING DIFFERENT TYPES OF MEMORY DEVICES" filed Jan. 28, 2015 which is hereby incorporated by reference in its entirety.

BACKGROUND

Computing devices such as desktop computing devices, laptop computing devices, and server computing devices include data storage devices. Among these data storage devices are pluggable in-line memory devices.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

Figure 1A:
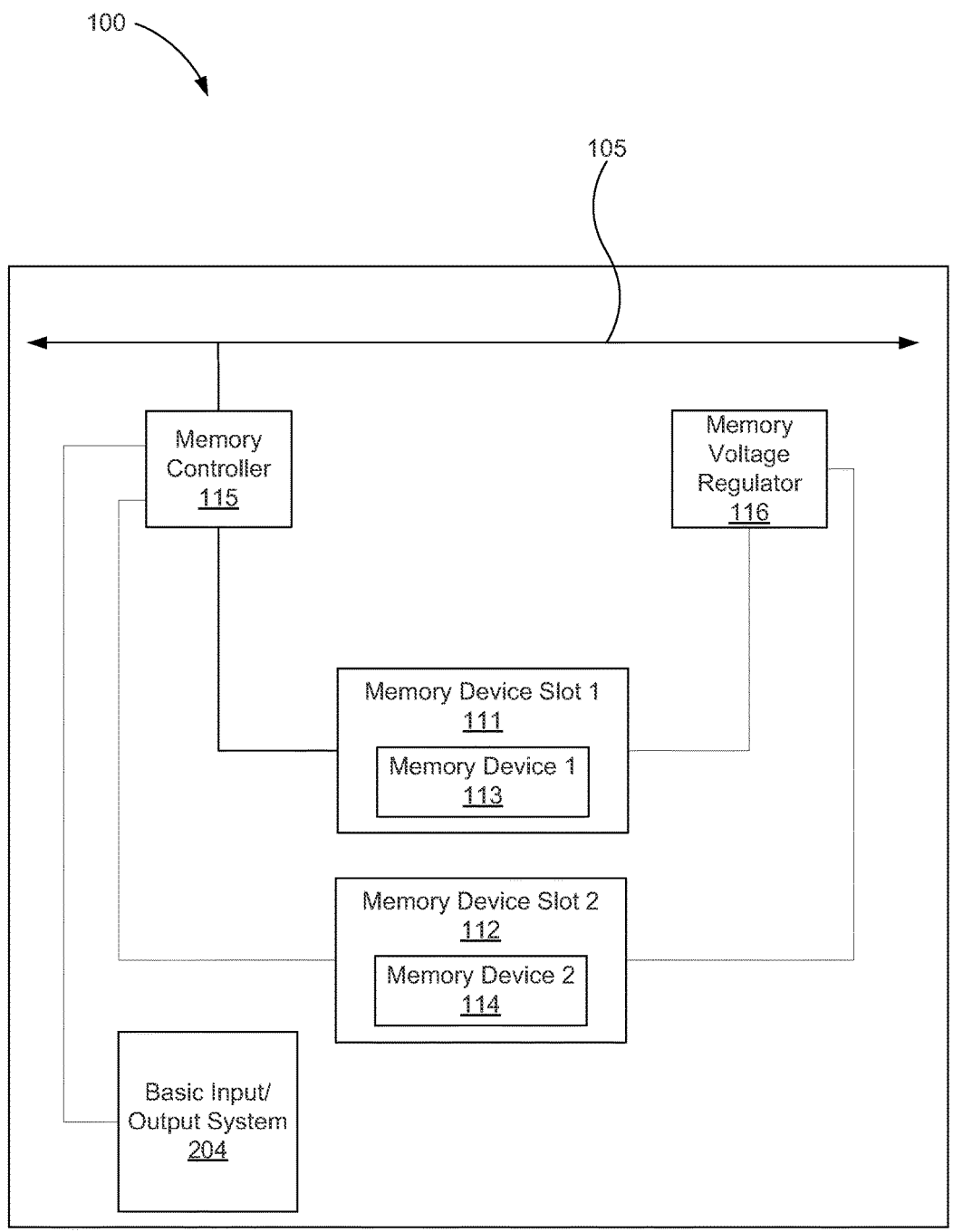
FIG. 1A is a block diagram of a memory of a computing system for supporting different types of memory devices, according to one example of the principles described herein.

Pluggable in-line memory devices include memory devices such as single in-line memory devices (SIMMs) and dual in-line memory devices (DIMMs). A DIMM includes a series of dynamic random-access memory integrated circuits. These memory devices are mounted on a printed circuit board, and are designed for use in personal computers, workstations, and servers. Double data rate third generation synchronous dynamic random-access memory (DDR3 SDRAM) is a type of dynamic random-access memory (DRAM) used in DIMM memory devices. DDR3 SDRAM includes a high bandwidth ("double data rate") interface. DDR3 SDRAM is neither forward nor backward compatible with any earlier type of random-access memory (RAM) because of different signaling voltages, timings, and other factors. Double data rate fourth generation synchronous dynamic random-access memory (DDR4 SDRAM), is also a type of dynamic random-access memory (DRAM) used in DIMM memory devices, with a double data rate interface. DDR4 SDRAM is not compatible with any earlier type of random access memory (RAM) including DDR4 SDRAM due to different signaling voltages, physical interface, and other factors.

A computing device manufacture may manufacture their computing devices to include one of many types of memory device slots and corresponding memory device type. For example, a computer device may be designed to support only one type of memory such as DDR3 SDRAM or DDR4 SDRAM. However, when a computing device market is being transitioned from one memory storage technology to another during the life of the computing device or during the design of a computing platform, designing or redesigning the computing device or the designed platform with either type of memory could result in a competitive disadvantage in the market as to the computing device manufacturer. On one hand, if the computing device manufacturer is to choose to support only the older memory device type such as a DDR3 SDRAM, then this may cause the computing device or the designed platform to be at a performance disadvantage relative to a competitor's support of a relatively newer memory device type such as a DDR4 SDRAM. On the other hand, if the computing device manufacturer is to choose to support only the newer memory device type (DDR4 SDRAM), then this may cause the computing device or the designed platform to be at a cost disadvantage in the market relative to a competitor's support of the relatively older, less expensive memory device type (DDR3 SDRAM).

Further, from the perspective of a purchaser of a computing device, the purchaser may wish to replace or update an in-line memory device. However, without compatible computing topology such as an updated slot located on the motherboard of the computing device, a user is not able to replace or update an in-line memory device. Similarly, a purchaser of a computing device may have an existing computing device with, for example, a DDR3 SDRAM, and now he or she desires to buy a new, next generation computing device, but the next generation computing device may include, for example, only DDR4 SDRAM slots for coupling a number of DDR4 SDRAM devices. The examples described herein allow a computing device manufacturer to satisfy the needs of the customer by allowing him or her to re-use the existing DDR3 memory by providing a computing device that provides a number of different type memory device slots such as DDR3 SDRAM slots, DDR4 SDRAM slots, and next generation SDRAM slots (e.g., DDR5 SDRAM slots).

Examples described herein provide a computing device for supporting a plurality of different types of memory devices. The computing device includes a plurality of types of memory device slots on a printed circuit board (PCB) to connect a corresponding number and types of memory devices to the computing device. A memory voltage regulator coupled to the memory device slots is also included. The computing device also includes a memory controller coupled to the memory device slots. The memory controller determines serial presence detect (SPD) data present on a detected memory device coupled to one of the memory device slots to determine the type of the detected memory device of the number of memory device types. The memory controller also instructs the memory voltage regulator to adjust a supply voltage to a voltage required by the detected memory device based on the SPD data. The memory controller also controls input/output signals to and from the detected memory device based on the SPD data.

In one example, a first type of memory device type and corresponding first memory device type device is a double data rate type third generation synchronous dynamic random-access memory (DDR3) device. In this example, a second type of memory device slot and corresponding second memory device type is a double data rate type fourth generation synchronous dynamic random-access memory (DDR4) device.

In one example, the memory voltage regulator switches voltages to the requisite power rail based on the SPD data, general-purpose input/output (GPI( ) data, or combinations thereof present on the detected memory device. GPIOs are generic pins located on the memory devices (113, 114). In one example, the memory controller receives data regarding the type of the detected memory device from a basic input/output system (BIOS) firmware package. In one example, at least one of the types of memory devices is a double data rate type third generation synchronous dynamic random-access memory (DDR3) device. Further, in one example, at least one of the types of memory devices is a double data rate type fourth generation synchronous dynamic random-access memory (DDR4) device.

The memory controller supports multiple types of memory devices. In addition, the memory voltage regulator interfaces with the multiple types of memory devices. In one example, the memory voltage regulator supports any number of types of memory devices that a computing device manufacturer or designer designs the computing device to support.

As used in the present specification and in the appended claims, the term "a number of" or similar language is meant to be understood broadly as any positive number comprising 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described in connection with that example is included as described, but may not be included in other examples.

Turning now to the figures, FIG. 1A is a block diagram of a memory of a computing system (100) for supporting different types of memory devices, according to one example of the principles described herein. To achieve its desired functionality, the computing system (100) includes various hardware components. Among these hardware components may be a number of memory controllers (115), a number of memory voltage regulators (116), a plurality of types of memory device slots (111, 112), a number of memory devices (113, 114), and a basic input/output system (BIOS) (204). These hardware components may be interconnected and connected to other computing devices through the use of a number of busses and/or network connections. In one example, the memory controllers (115), memory voltage regulators (116), memory device slots (111, 112), and memory devices (113, 114) may be communicatively coupled to a bus (105) that provides connectivity to other computing elements within the computing system (100) as will be described in more detail below in connection with FIG. 1B.

The memory controller works in concert with a processor to determine serial presence detect (SPD) data present on a detected memory device (113, 114) to determine the type of the detected memory devices of a plurality of memory device types corresponding to the types of memory device slots (111, 112). In one example, the memory voltage regulators (116) adjust a supply voltage to a voltage required by a detected memory device (113, 114) based on the SPD data. In another example, the memory controller (115), the processor (FIG. 1B, 101), or combinations thereof instruct the memory voltage regulators (116) to adjust a supply voltage to a voltage required by a detected memory device (113, 114) based on the SPD data. The memory controller (115) controls input/output signals to and from the detected memory device (113, 114) based on the SPD data. In one example, a number of the memory device slots (111, 112), memory devices (113, 114), memory controllers (115), and memory voltage regulators (116) are located on a common printed circuit board. More details regarding the computing system (100) for supporting different types of memory devices (13, 114) will now be provided in connection with FIG. 1B.

Figure 1B:
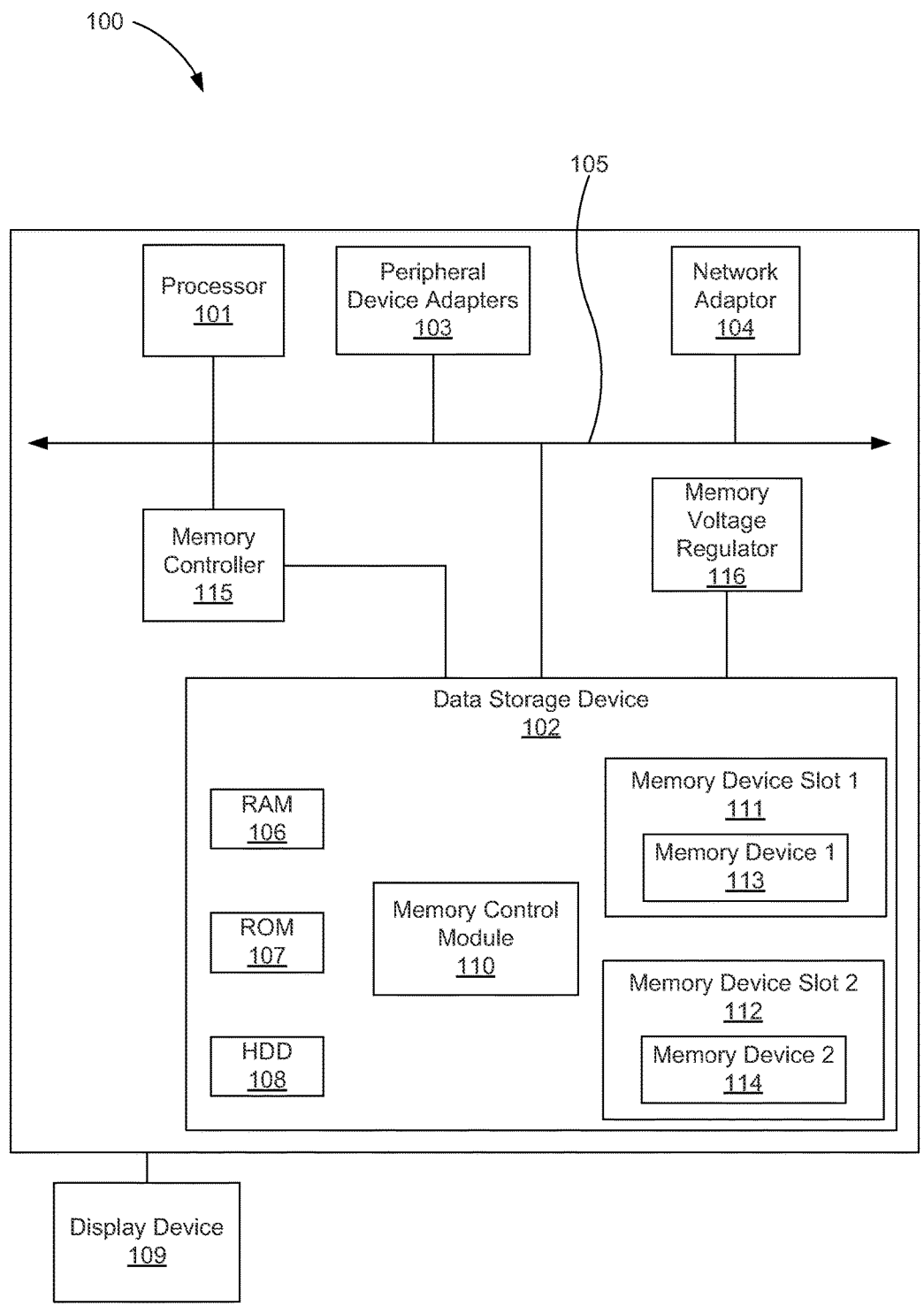
FIG. 1B is a block diagram of a computing system for supporting different types of memory devices, according to another example of the principles described herein.

FIG. 1B is a block diagram of a computing system (100) for supporting different types of memory devices, according to another example of the principles described herein. The computing system (100) may be implemented in an electronic device. Examples of electronic devices include servers, desktop computers, laptop computers, personal digital assistants (PDAs), mobile devices, smartphones, gaming systems, and tablets, among other electronic devices.

The computing system (100) may be utilized in any data processing scenario including, stand-alone hardware, mobile applications, through a computing network, or combinations thereof. Further, the computing system (100) may be used in a computing network, a public cloud network, a private cloud network, a hybrid cloud network, other forms of networks, or combinations thereof. Further, the computing system (100) may be implemented on one or multiple hardware platforms, in which the modules in the system can be executed on one or across multiple platforms. Such modules can run on various forms of cloud technologies and hybrid cloud technologies or offered as a SaaS (Software as a service) that can be implemented on or off the cloud. In another example, the methods provided by the computing system (100) are executed by a local administrator.

To achieve its desired functionality, the computing system (100) includes various hardware components. Among these hardware components may be a number of processors (101), a number of data storage devices (102), a number of peripheral device adapters (103), and a number of network adapters (104), These hardware components may be interconnected through the use of a number of busses and/or network connections. In one example, the processors (101), data storage devices (102), peripheral device adapters (103), and a network adapters (104) may be communicatively coupled via a bus (105).

The processor (101) may include the hardware architecture to retrieve executable code from the data storage device (102) and execute the executable code. The executable code may, when executed by the processor (101), cause the processor (101) to implement at least the functionality of determining serial presence detect (SPD) data present on a detected memory device to determine the type of the detected memory device of a plurality of memory device types corresponding to the types of memory device slots. The functionality may also include instructing a memory voltage regulator to adjust a supply voltage to a voltage required by the detected memory device based on the SPD data, and controlling input/output signals to and from the detected memory device based on the SPD data. In one example, the memory controller (115) is initialized to perform these functions for and based on the type of memory device installed in the computing system (100). The functionality of the processor (101) are performed according to the methods of the present specification described herein. In the course of executing code, the processor (101) may receive input from and provide output to a number of the remaining hardware units.

The data storage device (102) may store data such as executable program code that is executed by the processor (101) or other processing device. As will be discussed, the data storage device (102) may specifically store computer code representing a number of applications that the processor (101) executes to implement at least the functionality described herein.

The data storage device (102) may include various types of memory devices, including volatile and nonvolatile memory. For example, the data storage device (102) of the present example includes Random Access Memory (RAM) (106), Read Only Memory (ROM) (107), and Hard Disk Drive (HDD) memory (108). Many other types of memory may also be utilized, and the present specification contemplates the use of many varying type(s) of memory in the data storage device (102) as may suit a particular application of the principles described herein. In one example, different types of memory in the data storage device (102) may be used for different data storage needs. For example, the processor (101) may boot from Read Only Memory (ROM) (107), maintain nonvolatile storage in the Hard Disk Drive (HDD) memory (108), and execute program code stored in Random Access Memory (RAM) (106).

Figure 2:
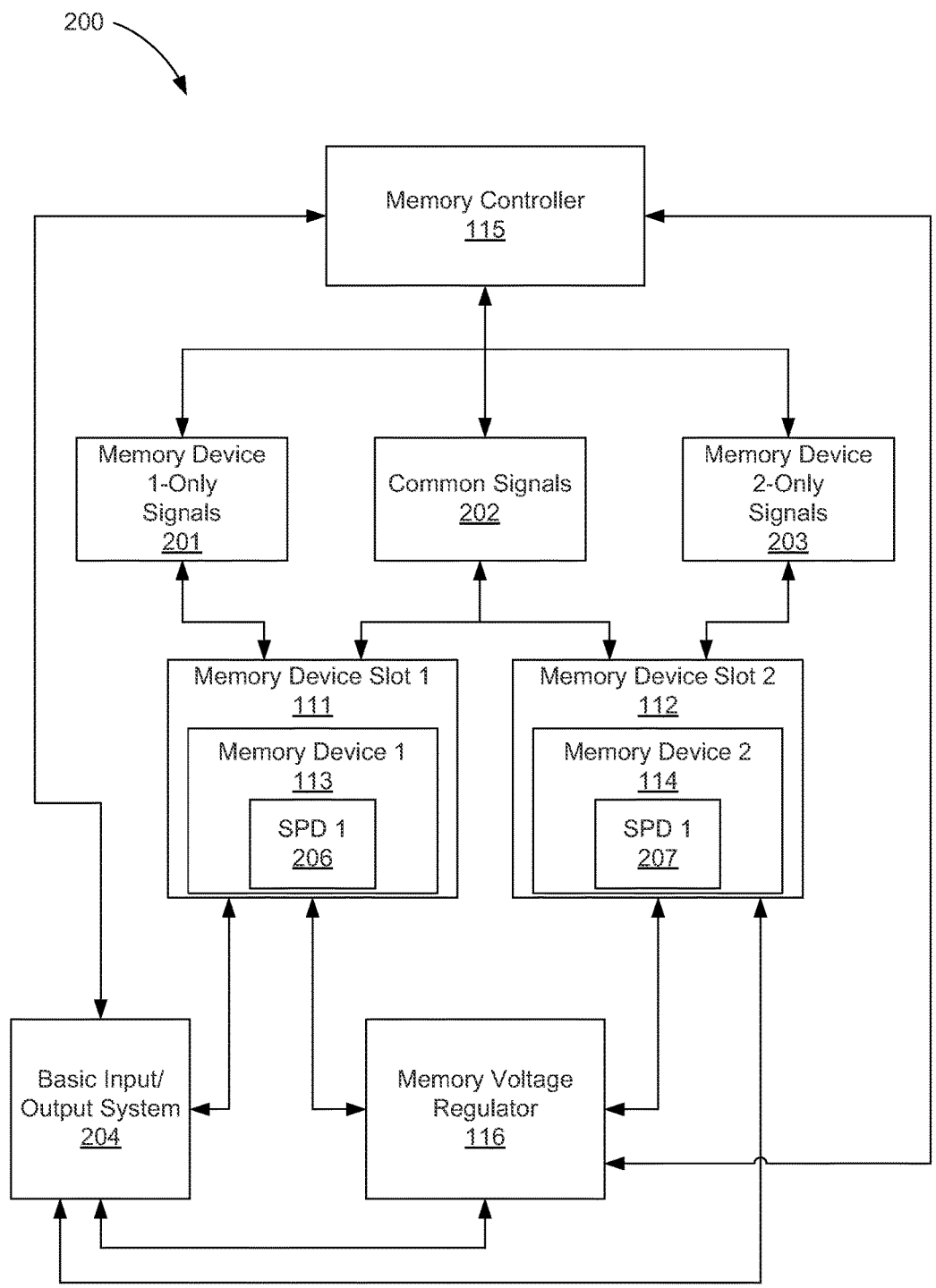
FIG. 2 is a block diagram of a memory controller and memory voltage regulator of the computing system of FIGS. 1A and 1B, according to one example of the principles described herein.

The data storage device (102) also includes a number of memory device slots (111, 112) to which a number of memory devices (113, 114) such as the above-described DDR3 and DDR4 protocol compliant storage devices may be coupled to. Although two memory device slots (111, 112) are depicted in FIGS. 1 and 2, any number of memory device slots (111, 112) may be coupled to the computing system (100).

The computing system of FIG. 1B also includes a memory controller (115). The memory controller works in concert with the processor (101) to determine serial presence detect (SPD) data present on a detected memory device (113, 114) to determine the type of the detected memory device of a plurality of memory device types corresponding to the types of memory device slots (111, 112).

The functionality may also include instructing a memory voltage regulator (116) to adjust a supply voltage to a level required by the detected memory device (113, 114) based on the SPD data, and controlling input/output signals to and from the detected memory device (113, 114) based on the SPD data. In one example, a number of the processor (101), memory device slots (111, 112), memory devices (113, 114), memory controller (115), and memory voltage regulator (116) are located on a common printed circuit board.

The data storage devices described herein including the data storage device (102), the RAM (106), the ROM (107), the HDD memory (108), and memory devices (113, 114), and other memory devices described herein may include a computer readable medium, a computer readable storage medium, or a non-transitory computer readable medium, among others. For example, the data storage devices described herein may be, but not limited to, an electronic, magnetic, optical, electromagnetic, infrared, or semiconductor system, apparatus, or device, or any suitable combination of the foregoing. More specific examples of the computer readable storage medium may include, for example, the following: an electrical connection having a number of wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store computer usable program code for use by or in connection with an instruction execution system, apparatus, or device. In another example, a computer readable storage medium may be any non-transitory medium that can contain, or store a program for use by or in connection with an instruction execution system, apparatus, or device.

The hardware adapters (103, 104) in the computing system (100) enable the processor (101) to interface with various other hardware elements, external and internal to the computing system (100). For example, the peripheral device adapters (103) may provide an interface to input/output devices, such as, for example, display device (109), a mouse, or a keyboard as well as the memory device slots (111, 112) and memory devices (113, 114). The peripheral device adapters (103) may also provide access to other external devices such as an external storage device, a number of network devices such as, for example, servers, switches, and routers, client devices, other types of computing devices, and combinations thereof.

The computing system (100) further includes a number of modules used in the implementation of the functionality described herein. The various modules within the computing system (100) include executable program code that may be executed separately. In this example, the various modules may be stored as separate computer program products. In another example, the various modules within the computing system (100) may be combined within a number of computer program products; each computer program product including a number of the modules.

In one example, the processor (101) as instructed by the BIOS (FIG. 2, 204) code, determines the type of memory installed. In this example, the BIOS (FIG. 2, 204) includes a number of provisions for initializing the voltage regulator (116) and memory controller (115) to detect a number and type of memory devices (113, 114) connected to the memory device slots (111, 112). In another example, the computing system (100) may include a memory control module (110) to, when executed by the processor (101) or memory controller (115), detect a number and type of memory devices (113, 114) connected to the memory device slots (111, 112).

The memory control module (110) also controls transmission of signals to and from the memory devices (113, 114) connected to the memory device slots (111, 112). The computing system (100) also includes a BIOS (FIG. 2, 204). The BIOS (FIG. 2, 204) includes instructions that activate a GPIO on hardware that was routed to the memory voltage regulator (116) to instruct the memory voltage regulator (116) to adjust its voltage outputs appropriately.

FIG. 2 is a block diagram of a memory controller (115) and memory voltage regulator (116) of the computing system (100) of FIGS. 1A and 1B, according to one example of the principles described herein. Different memory modules (113, 114) may have disparate physical and electrical properties including different signaling voltages, different pin assignments, different form factors, and different connector notch placements, among other differences. At least one of these different properties may render a particular generation of memory device such as SDRAM devices, for example, neither forward nor backward compatible with any earlier or later type of data storage device. In this scenario, it is difficult for a computing system manufacturer to decide between offering their computing platforms with an older, relatively cheaper memory device type or to offer their computing platform with the newest but relatively more expensive memory device type. If the manufacturer were to offer the older, relatively cheaper memory device type within their computing platform, the cost of manufacturing the computing platform would go down and the manufacturer may even sell more computing units because the cost of the computing unit would also be relatively cheaper.

However, if demand in the market for a computing platform with the relatively newer and more expensive memory device increased, and the manufacturer chose to offer their computing platform with the relatively older and cheaper memory device, then the manufacturer may have a portion of its market share taken by a competitor that offers a computing platform including the relatively newer and more expensive memory device. On the other hand, if demand in the market for a computing platform with the relatively newer and more expensive memory device has not increased or has decreased, and the manufacturer chose to offer their computing platform with the relatively newer and more expensive memory device, then the manufacturer may have a portion of its market share taken by a competitor that offers a computing platform including the relatively older and cheaper memory device.

Thus, it would be advantageous for a computer platform manufacturer to be able to have the option of providing any data storage device in their computer platform even up until a point after manufacture of the computing system (100). With this, the computing system of FIGS. 1A, 1B, and 2 provide for this ability. As depicted in FIG. 2, the computing system (FIGS. 1A and 1B, 100) may include the memory controller (115), the memory device slots (111, 112) the memory devices (113, 114) coupled to the memory device slots (111, 112), and the memory voltage regulator (116). In order to provide electrical connectivity between the memory controller (115) and the memory devices (113, 114), a number of data signal lines (201, 202, 203) may be provided. Because different memory modules (113, 114) have disparate signaling requirements and pinouts, the data signal lines (201, 202, 203) provide for different signals to be transmitted to the different memory modules (113, 114). In one example, a comparison of data signals transmitted by disparate data storage devices are provided in Table 1 where the data signals of a DDR3 data storage device are compared to data signals of a DDR4 data storage device.

TABLE 1

List of Common and Non-common Memory Signals Between DDR3 and DDR4 Memory Devices

|  | DDR3 Memory Interface | DDR4 Memory Interface |  |
|---|---|---|---|
| Common Signals | DDR0_ECC[7:0] | DDR0_ECC[7:0] |  |
|  | DDR0_DQ[63:0] | DDR0_DQ[63:0] |  |
|  | DDR0_DQSP[8:0] | DDR0_DQSP[8:0] |  |
|  | DDR0_DQSN[8:0] | DDR0_DQSN[8:0] |  |
|  | DDR0_CKN[3:0] | DDR0_CKN[3:0] |  |
|  | DDR0_CKP[3:0] | DDR0_CKP[3:0] |  |
|  | DDR0_CKE[3:0] | DDR0_CKE[3:0] |  |
|  | DDR0_CS#[3:0] | DDR0_CS#[3:0] |  |
|  | DDR0_ODT[3:0] | DDR0_ODT[3:0] |  |
|  | DDR0_VREF_CA | DDR0_VREF_CA |  |
|  | DDR0_MA[15:0] | DDR0_MA[15:0] |  |
|  | DDR0_BA[1:0] | DDR0_BA[1:0] |  |
| DDR3-only | DDR0_CAS# | DDR0_ACT# | DDR4-only Signals |
|  | DDR0_RAS# | DDR0_BG[1:0] |  |

TABLE 1-continued

List of Common and Non-common Memory Signals Between DDR3 and DDR4 Memory Devices

|  | DDR3 Memory Interface | DDR4 Memory Interface |
|---|---|---|
| Signals | SSR0_WE# | DDR0_ALERT# |
|  | DDR0_VREF_DQ | DDR0_PAR |
|  | DDR0_BA bit [2] | DDR0_MA bit [16] |

As can be seen in Table 1, there are a number of signals common to a DDR3 data storage device and a DDR4 data storage device. These common signals are transferred between the memory controller (115) and the memory devices (113, 114) via the common signal line (202). There are, however a number of signals particular to a DDR3 data storage device as depicted in Table 1. These DDR3 signals may be sent via the memory device 1 signal line (201). Similarly, as depicted in Table 1, a number of signals particular to a DDR4 data storage device may be sent via the memory device 2 signal line (203). Although one common signal line (202) and two different memory device signal lines (201, 203) are depicted in FIG. 2, any number of common and disparate signal lines may be included in the computing system (100). In one example, the number of disparate signal lines (201, 203) particular to a specific type of memory device (113, 114) may be included to match a corresponding number of different memory devices (113, 114). Some computing device manufacturers such as, for example, Intel Corporation, require that all memory devices attached to any given memory controller be of the same memory type. The examples herein provide multiple memory types on every memory channel. Thus, for any given memory type coupled to the computing system (100), all memory channels are still available for use and memory performance is not impacted.

As different memory devices (113, 114) of the computing system (100) are added to the computing system (100), the memory controller (115) determines what type of memory device (113, 114) was added to the memory device slots (111, 112). In one example, the memory controller (115) determines what type of memory device (113, 114) was added to the memory device slots (111, 112) by obtaining serial presence detect (SPD) data from the memory devices (113, 114). SPD data is information about a computer memory device including data about what type of memory is coupled to the memory device slots (111, 112), what timings are to be used to access the memory, and what voltages are required for that particular memory device (113, 114).

When the computing system is powered on, a power-on self-test (POST) process may be performed in which SPD data is obtained. In one example, the SPD data is stored on an Electrically Erasable Programmable Read-Only Memory (EEPROM) included on the memory devices (113, 114). In one example, the memory controller (115) is initialized by the basic input/output system (BIOS) (204) as to what type of memory device (113, 114) installed such as whether a DDR3 or a DDR4 device is installed. In this example, the BIOS (204) is coupled to the memory controller (115) and all the memory devices (113, 114) and their respective EEPROMs (206, 207) in order to detect the SPD data on the memory devices (113, 114) and initialize the memory controller (115) in accordance with the SPD data.

In one example, only one type of memory device may be coupled to the computing system (100) at a time. In this example, if more than one memory type were coupled to the computing system (100), the computing system (100) may detect the presence of at least two different memory types, and will not proceed with processing associated with the memory types. This is because the memory controller is assumed to only allow a single memory type to be installed in the system. In one example, the computing system (100) informs a user of the fact that two different memory types are installed.

In another example, any number of types of memory devices may be coupled to the computing system (100) at any given time. In this example, the memory controller (115) and processor (101) are able to transmit data signals to and from all memory devices installed in the computing system (100).

The memory voltage regulator (116) is coupled to the memory devices (113, 114), the BIOS (204), and the memory controller (115). The memory voltage regulator (116), when instructed by the BIOS (204) or the memory controller (115), adjusts a supply voltage to a voltage required by the detected memory device based on the SPD data. In the example of a DDR3 DIMM storage device and a DDR4 DIMM storage device, DDR4 operates at a voltage of 1.2 V as compared to 1.5 or 1.65 V for DDR3 or 1.35 V for a DDR3L low power memory device. In this example, the BIOS (204) or the memory controller (115) instructs the memory voltage regulator (116) to adjust the voltage provided to the memory devices (113, 114) based on the type of memory device (113, 114) installed.

In one example, voltage requirements data is obtained by the BIOS (204) from, for example, the EEPROMs (206, 207) of the memory devices (113, 114) to assign the voltage output by the memory voltage regulator (116). In this example, data associated with the supply voltage of the memory devices (113, 114) is obtained from the EEPROMs (206, 207) of the memory devices (113, 114) and provided to the BIOS (204). The BIOS (204) instructs the memory voltage regulator (116) to provide the supply voltage to the memory devices (113, 114) according to the voltage requirements data. Having described the computing system (100) and its various elements, the processes associated with the computing system (100) will now be described.

Figure 3:
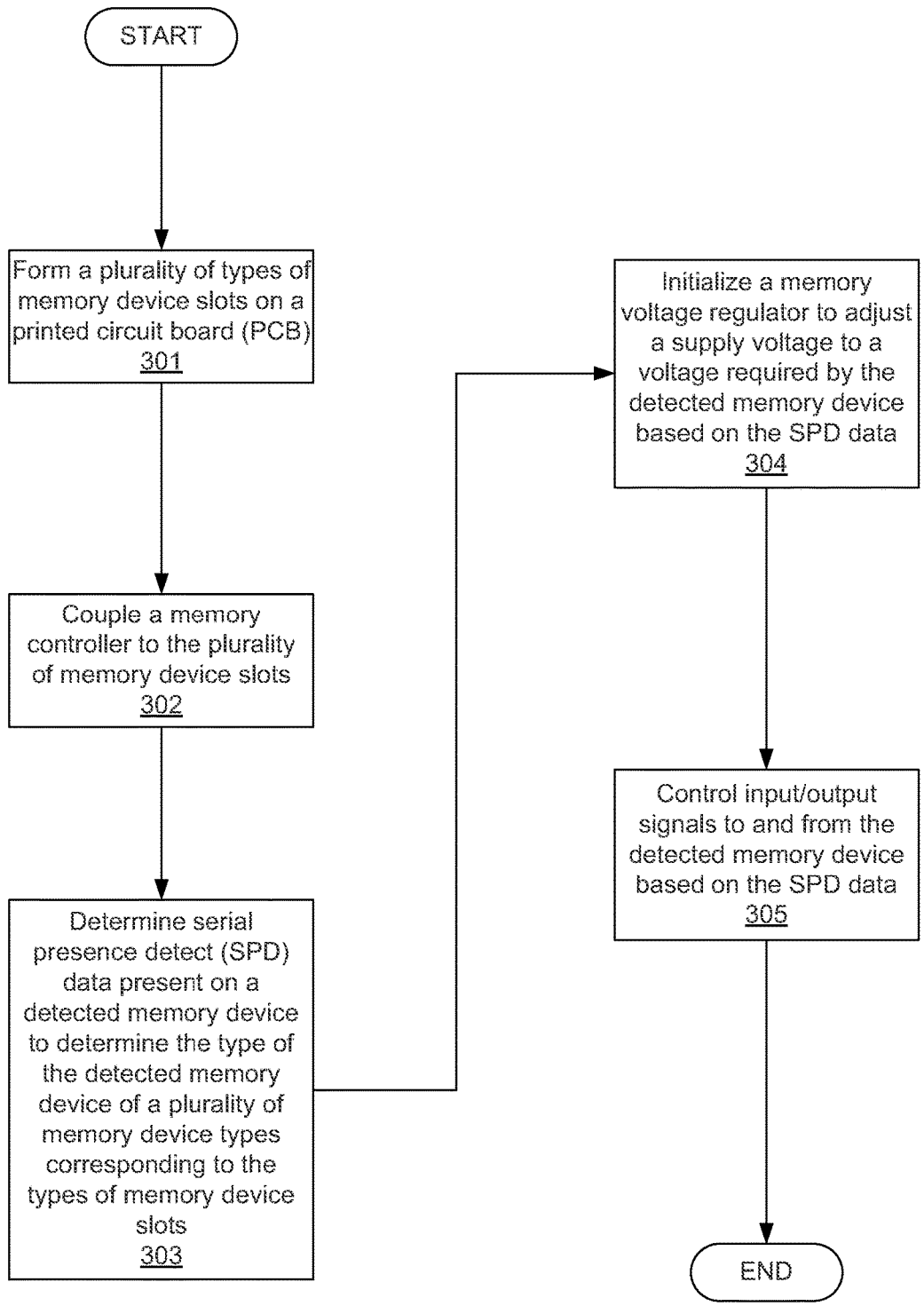
FIG. 3 is a flowchart depicting a method of operating a computing system that supports different types of memory devices, according to one example of the principles described herein.

FIG. 3 is a flowchart depicting a method of manufacturing a computing system (100) that supports different types of memory devices (113, 114), according to one example of the principles described herein. FIG. 3 demonstrates a method of switching support of different types of memory devices in a computing device. The method of FIG. 3 may begin by forming (block 301) a plurality of types of memory device slots (111, 112) on a printed circuit board (PCB). A memory controller (115) is coupled (block 302) to the plurality of memory device slots (111, 112).

In one example, the processor (101), BIOS (204), or combinations thereof determine (block 303) serial presence detect (SPD) data present on a detected memory device (113, 114) to determine the type of the detected memory device of a plurality of memory device types corresponding to the types of memory device slots (111, 112). The processor (101), BIOS (204), or combinations thereof instruct (block 304) a memory voltage regulator (116) to adjust a supply voltage to a voltage required by the detected memory device (113, 114) based on the SPD data.

The processor (101), BIOS (204), or combinations thereof initialize the memory controller (115) to control (block 305) input/output signals to and from the detected memory device (113, 114) based on the SPD data to provide for proper communication between the memory controller (115) and the detected memory device (113, 114).

In another example, the memory controller (115) determines (block 303) serial presence detect (SPD) data present on a detected memory device (113, 114) to determine the type of the detected memory device of a plurality of memory device types corresponding to the types of memory device slots (111, 112). The memory controller (115) instructs (block 304) a memory voltage regulator (116) to adjust a supply voltage to a voltage required by the detected memory device (113, 114) based on the SPD data. The computing system (100) initializes the memory controller (115) to control (block 305) input/output signals to and from the detected memory device (113, 114) based on the SPD data to provide for proper communication between the memory controller (115) and the detected memory device (113, 114).

Figure 4:
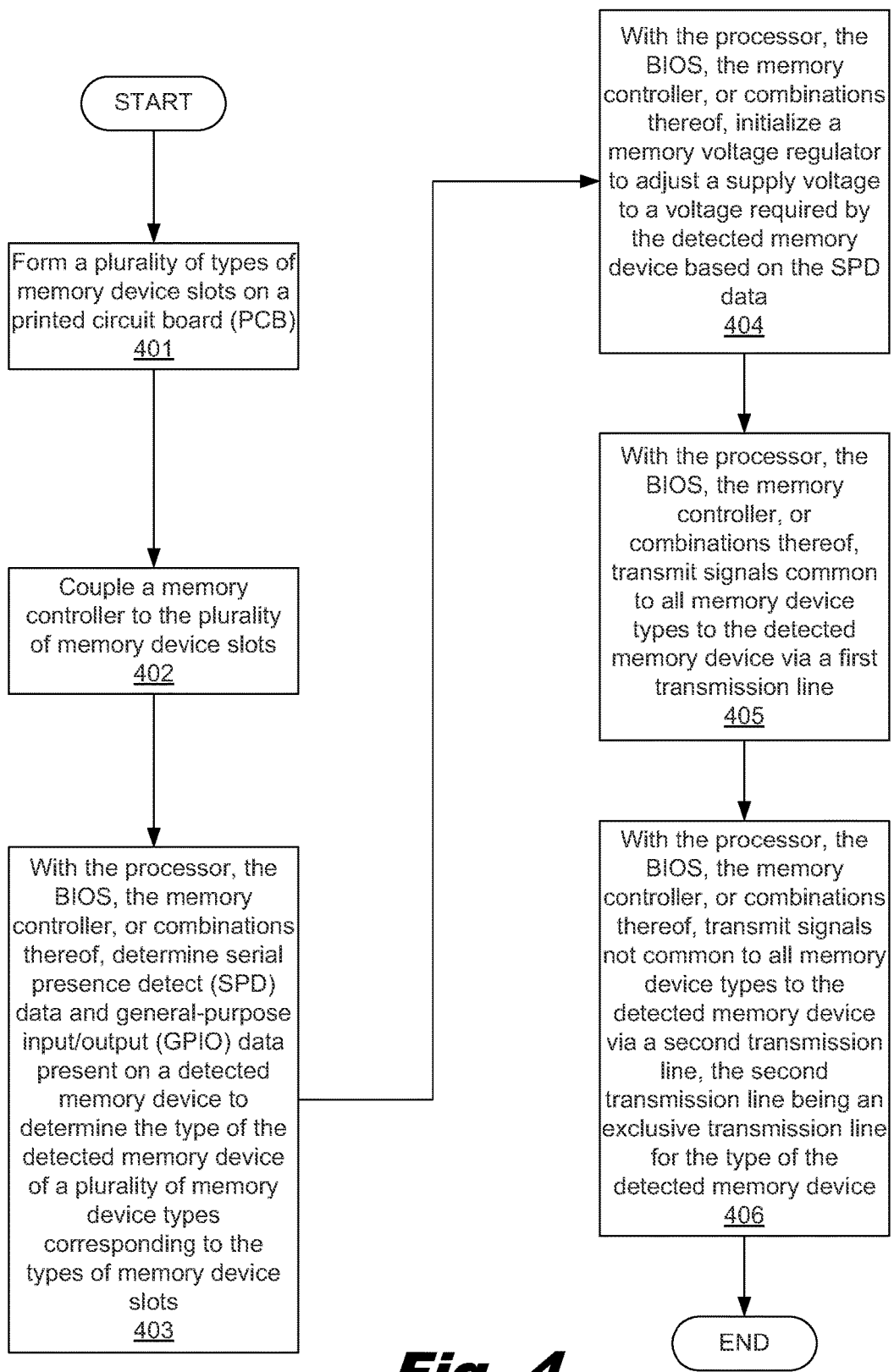
FIG. 4 is a flowchart depicting a method of operating a computing system that supports different types of memory devices, according to another example of the principles described herein.

FIG. 4 is a flowchart depicting a method of manufacturing a computing system that supports different types of memory devices, according to another example of the principles described herein. The method of FIG. 4 may begin by forming (block 401) a plurality of types of memory device slots (111, 112) on a printed circuit board (PCB). A memory controller (115) is coupled (block 402) to the plurality of memory device slots (111, 112).

The processor (101), BIOS (204), or combinations thereof determines (block 403) serial presence detect (SPD) data present on a detected memory device (113, 114) to determine the type of the detected memory device of a plurality of memory device types corresponding to the types of memory device slots (111, 112). In one example, the processor (101), BIOS (204), or combinations thereof receive data regarding the type of the detected memory device (113, 114) from the BIOS (204). In the examples described above, at least one of the types of memory devices (113, 114) is a double data rate type third generation synchronous dynamic random-access memory (DDR3) device, and at least one of the types of memory devices (113, 114) is a double data rate type fourth generation synchronous dynamic random-access memory (DDR4) device. However, the memory controller (115) supports all of the number of types of memory devices (113, 114) including future types of memory devices such as DDR5 SDRAM devices.

The processor (101), BIOS (204), or combinations thereof instruct (block 404) a memory voltage regulator (116) to adjust a supply voltage to a voltage required by the detected memory device (113, 114) based on the SPD data. At block 405, the processor (101), BIOS (204), or combinations thereof transmit signals common to all memory device types to the detected memory device (113, 114) via a first transmission line. In this example, the first transmission line that provides the common signals is the common signal line (202) of FIG. 2. The processor (101), BIOS (204), or combinations thereof transmit (block 406) signals not common to all memory device types to the detected memory device (113, 114) via a second transmission line. The second transmission line is an exclusive transmission line for the type of the detected memory device (113, 114). Thus, in this example, the second transmission line is the memory device signal lines (201, 203) depicted in FIG. 2. At any given time, one of the memory device signal lines (201, 203) is active.

Throughout the examples described herein, determining the types of memory devices installed is performed programmatically by reading SPD data. While this is a very elegant and user-friendly solution, other examples may user simpler means. In one example, a physical switch may be included in the computing system (100). In this example, the physical switch may be labeled "DDR3" for one position and "DDR4" for the another position. Other indicators for any number of additional memory types may also be included. The computing system (100) may instruct a user to set the physical switch to the desired setting depending on the memory type installed. Thus, in this example, rather than reading SPD data, the processor (101), BIOS (204), memory controller (115), or combinations thereof may instead read the physical switch setting to determine the memory type. In this manner, the voltage regulator (116) is set and the memory controller (115) is initialized.

In another example, a setting may be included in BIOS (204) wherein a user may adjust a setting to indicate the memory type. In this example, rather than reading SPD data, the processor (101), BIOS (204), memory controller (115), or combinations thereof may instead read the setting in the BIOS (204) as indicated by the user to determine the memory type. Any other methods or systems may be used to determine the type of memory device installed in the computing system (100) besides reading SPD data as described above.

Aspects of the present system and method are described herein with reference to flowchart illustrations and/or block diagrams of methods, apparatus (systems) and computer program products according to examples of the principles described herein. Each block of the flowchart illustrations and block diagrams, and combinations of blocks in the flowchart illustrations and block diagrams, may be implemented by computer usable program code. The computer usable program code may be provided to a processor of a general purpose computer, special purpose computer, or other programmable data processing apparatus to produce a machine, such that the computer usable program code, when executed via, for example, the processor (101), the memory controller (115), the BIOS (204), or the memory voltage regulator (116) of the computer system (100) or other programmable data processing apparatus, implement the functions or acts specified in the flowchart and/or block diagram block or blocks. In one example, the computer usable program code may be embodied within a computer readable storage medium; the computer readable storage medium being part of the computer program product. In one example, the computer readable storage medium is a non-transitory computer readable medium.

The specification and figures describe a computing device for supporting a plurality of different types of memory devices. The system includes a plurality of types of memory device slots on a printed circuit board (FOB) to connect a corresponding number and types of memory devices to the computing device. A memory voltage regulator is coupled to the memory device slots. The computing device also includes a memory controller coupled to the memory device slots. The processor, BIOS, memory controller, or combinations thereof determine serial presence detect (SPD) data present on a detected memory device coupled to one of the memory device slots to determine the type of the detected memory device of the number of memory device types. The processor, BIOS, memory controller, or combinations thereof also instruct the memory voltage regulator to adjust a supply voltage to a voltage required by the detected memory device based on the SPD data. The processor, BIOS, memory controller, or combinations thereof control input/output signals to and from the detected memory device based on the SPD data.

This computing device for supporting a plurality of different types of memory devices may have a number of advantages, including: (1) providing flexibility and choice to a customer by allowing a computing system manufacturer to provide a number of different memory device slots to connect a number of memory devices; and (2) providing a computing system manufacture with the ability to provide a computing device with competitive computing options and retain market share, among other advantages.

The preceding description has been presented to illustrate and describe examples of the principles described. This description is not intended to be exhaustive or to limit these principles to any precise form disclosed. Many modifications and variations are possible in light of the above teaching.

What is claimed is:

1. A computing device for supporting a plurality of different types of memory devices, comprising:
   a plurality of types of memory device slots on a printed circuit board (PCB) to connect a corresponding number and types of memory devices to the computing device;
   a memory voltage regulator coupled to the memory device slots;
   a basic input/output system (BIOS) to: determine serial presence detect (SPD) data present on a detected memory device coupled to one of the memory device slots to determine the type of the detected memory device of the number of memory device types; and initialize the memory voltage regulator to adjust a supply voltage to a voltage required by the detected memory device based on the SPD data; and
   a memory controller coupled to the memory device slots, the memory controller to control input/output signals to and from the detected memory device based on the SPD data, wherein the memory controller transmits signals common to all memory device types to the detected memory device via a first transmission line and transmits signals not common to all memory device types to the detected memory device via a second transmission line, the second transmission line being an exclusive transmission line for the type of the detected memory device.

2. The computing device of claim 1, wherein the memory voltage regulator switches voltages to the requisite level based on the SPD data and general purpose input/output (GPIO) data present on the detected memory device.

3. The computing device of claim 1, wherein the memory controller receives data regarding the type of the detected memory device from the BIOS.

4. The computing device of claim 1, wherein at least one of the types of memory devices is a double data rate type third generation synchronous dynamic random-access memory (DDR3) device, double data rate type fourth generation synchronous dynamic random-access memory (DDR4) device, or a double data rate type fifth generation synchronous dynamic random-access memory (DDR5) device.

5. The computing device of claim 1, further comprising a processor, wherein the processor, the BIOS or combinations thereof determine the SPD data present on a detected memory device coupled to the memory device slots to determine the type of the detected memory device of the number of memory device types; and initialize the memory voltage regulator to adjust a supply voltage to a voltage required by the detected memory device based on the SPD.

6. The computing device of claim 1, wherein the memory controller supports all of the number of types of memory devices.

7. The computing device of claim 1, wherein the memory voltage regulator interfaces with all of the number of types of memory devices.

8. A computing system for supporting a plurality of different types of memory devices comprising:
- a memory voltage regulator to adjust a supply voltage to a requisite voltage for a detected memory device based on serial presence detect (SPD) data present on a detected memory device, the GPIO data defining a type of the detected memory device; and
- a basic input/output system (BIOS) to receive data regarding the type of the detected memory device; and
- initialize a memory controller that supports a plurality of types of memory devices, to control input/output signals relative to the type of the detected memory device based on the SPD data of the detected memory device, wherein the memory controller transmits more than one signal type common to all memory device types to the detected memory device via a first transmission line and transmits signals not common to all memory device types to the detected memory device via a second transmission line, the second transmission line being an exclusive transmission line for the type of the detected memory device.

9. The computing system of claim 8, wherein at least one of the types of memory devices is a double data rate type third generation synchronous dynamic random-access memory (DDR3) device.

10. The computing system of claim 8, wherein at least one of the types of memory devices is a double data rate type fourth generation synchronous dynamic random-access memory (DDR4) device.

11. The computing system of claim 8, wherein the memory voltage regulator interfaces with all of the number of types of memory devices.

12. A method of manufacturing a computing system that supports different types of memory devices, comprising:
- forming a plurality of types of memory device slots on a printed circuit board (PCB);
- coupling a memory controller to the plurality of memory device slots, the memory controller to, when initialized by a basic input/output system (BIOS):
- determine serial presence detect (SPD) data present on a detected memory device to determine the type of the detected memory device of a plurality of memory device types corresponding to the types of memory device slots;
- instruct a memory voltage regulator to adjust a supply voltage to a voltage required by the detected memory device based on the SPD data;
- transmit signals common to all memory device types to the detected memory device via a first transmission line; and
- transmit signals not common to all memory device types to the detected memory device via a second transmission line, the second transmission line being an exclusive transmission line for the type of the detected memory device.

13. The method of claim 12, further comprising, with the memory controller:
- determining a general-purpose input/output (GPIO) configuration associated with the detected memory device, wherein adjusting the supply voltage to the voltage required by the detected memory device based on the SPD data further comprises adjusting the supply voltage based on the GPIO data.

* * * * *